12) United States Patent
Kempitiya

(10) Patent No.: US 11,139,812 B2
(45) Date of Patent: Oct. 5, 2021

(54) IGBT EMITTER CURRENT SENSING FOR EARLY DESATURATION DETECTION AND SHORT CIRCUIT PROTECTION

(71) Applicant: Infineon Technologies AG, Neubiberg (DE)

(72) Inventor: Asantha Kempitiya, Cerritos, CA (US)

(73) Assignee: INFINEON TECHNOLOGIES AG, Neubiberg (DE)

(*) Notice: Subject to any disclaimer, the term of this patent is extended or adjusted under 35 U.S.C. 154(b) by 133 days.

(21) Appl. No.: 16/583,993

(22) Filed: Sep. 26, 2019

(65) Prior Publication Data
US 2021/0099167 A1 Apr. 1, 2021

(51) Int. Cl.
*H03K 17/082* (2006.01)
*H03K 17/042* (2006.01)

(52) U.S. Cl.
CPC ....... *H03K 17/0828* (2013.01); *H03K 17/042* (2013.01)

(58) Field of Classification Search
CPC ........... H03K 17/042; H03K 17/04206; H03K 17/04213; H03K 17/082; H03K 17/0822; H03K 17/0826; H03K 17/0828; H02M 1/32; H02M 3/156; H02M 3/157; H02M 3/158
See application file for complete search history.

(56) References Cited

U.S. PATENT DOCUMENTS

| | | | | |
|---|---|---|---|---|
| 5,689,394 A | * | 11/1997 | Esser | H03K 17/0828 361/56 |
| 6,832,356 B1 | * | 12/2004 | Ochi | H03K 17/0822 716/109 |
| 10,756,721 B2 | * | 8/2020 | Bacigalupo | H03K 17/0828 |
| 2004/0252435 A1 | * | 12/2004 | Ishikawa | H03K 17/0828 361/100 |
| 2014/0368240 A1 | * | 12/2014 | Shelton | H03K 17/168 327/109 |
| 2017/0317619 A1 | * | 11/2017 | Balasubramanian | H02M 1/08 |
| 2018/0115310 A1 | * | 4/2018 | Horiguchi | G01R 31/27 |
| 2020/0144998 A1 | * | 5/2020 | Inoue | H03K 17/0828 |
| 2021/0021121 A1 | * | 1/2021 | Lee | G01R 31/27 |
| 2021/0099082 A1 | * | 4/2021 | Romeo | H02M 3/156 |

* cited by examiner

*Primary Examiner* — Matthew V Nguyen
(74) *Attorney, Agent, or Firm* — Slater Matsil, LLP

(57) ABSTRACT

A gate driver system includes a gate driver having a first input for receiving a digital input signal, a second input for receiving a short circuit protection signal, and output for driving a power device; a current reconstruction circuit having a first input for receiving a voltage across an inductance associated with the power device, a second input for receiving a current associated with the power device, a third input for receiving the digital input signal, and an output for providing a sensed power device current; and a comparator having a first input coupled to the output of the current reconstruction circuit, a second input coupled to a reference, and an output coupled to the second input of the gate driver.

20 Claims, 15 Drawing Sheets

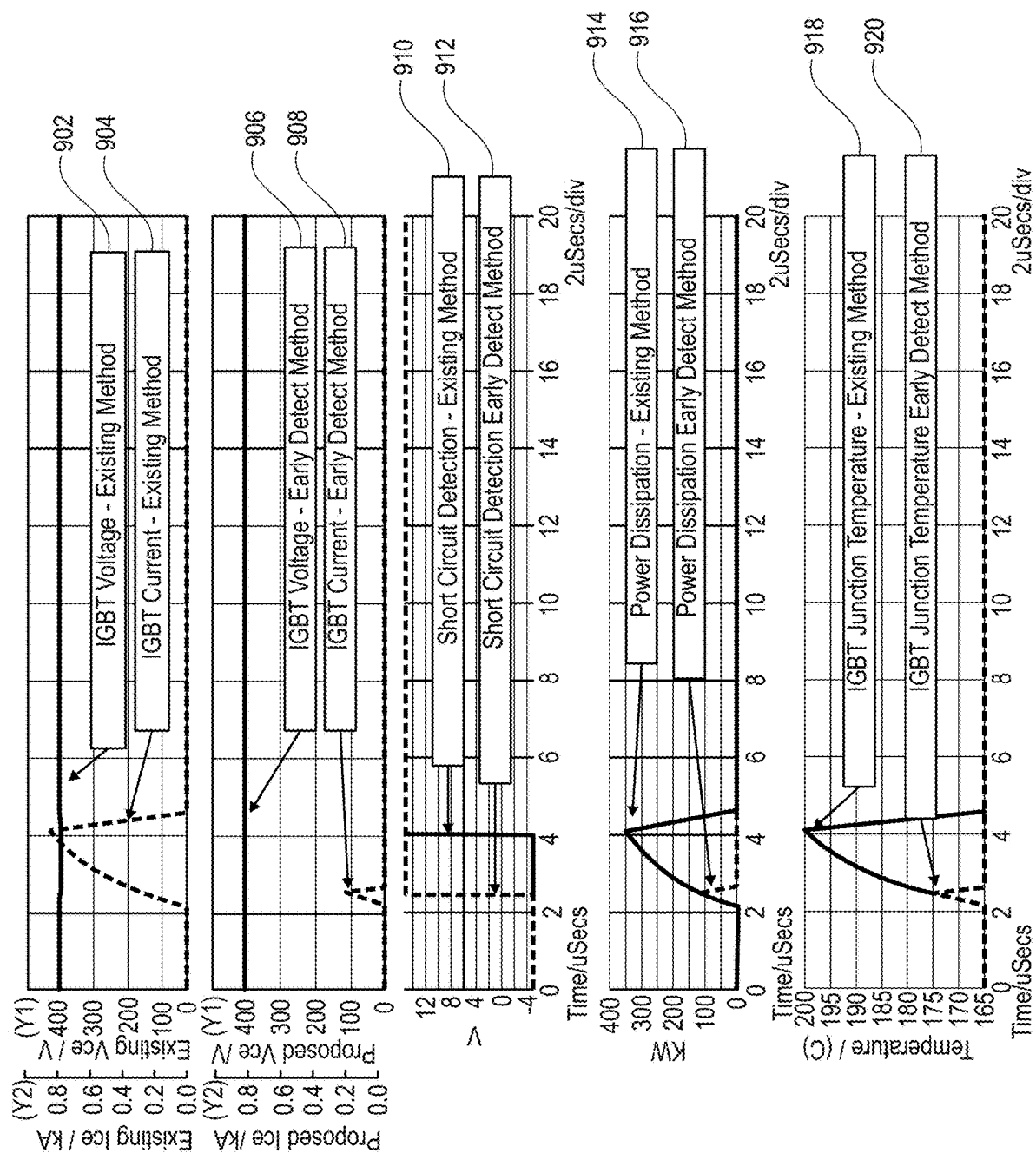

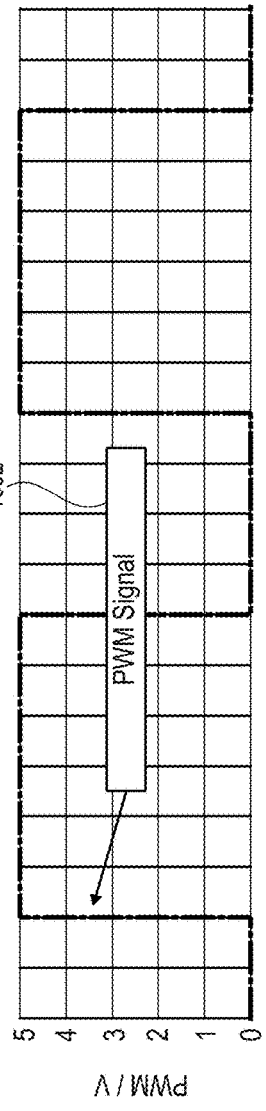
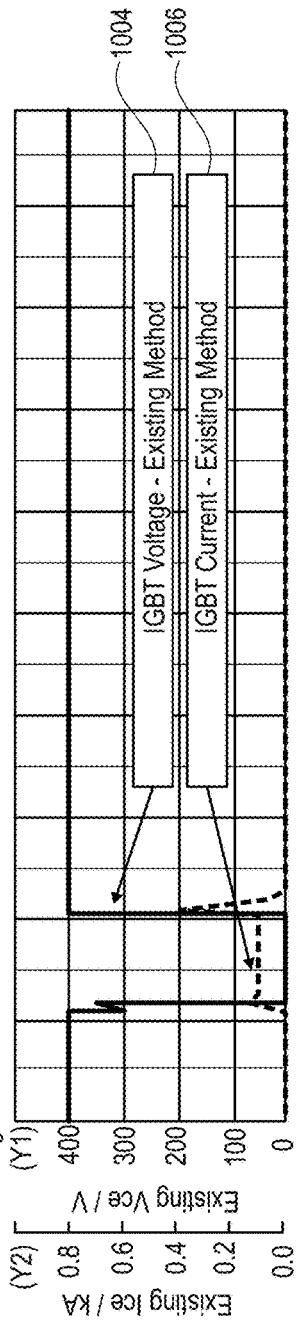
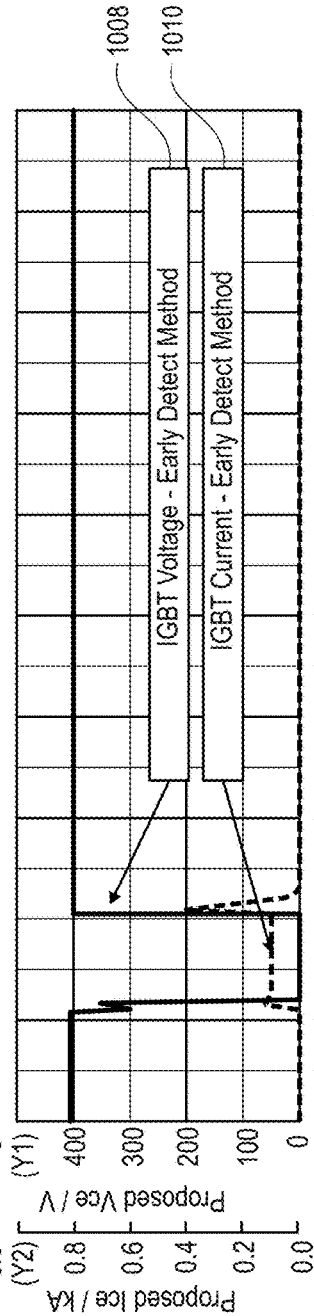
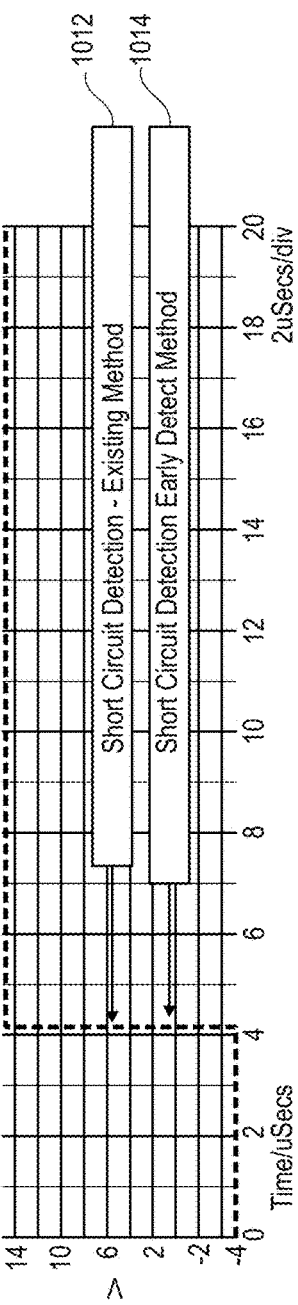
Fig. 10A
Fig. 10B
Fig. 10C
Fig. 10D

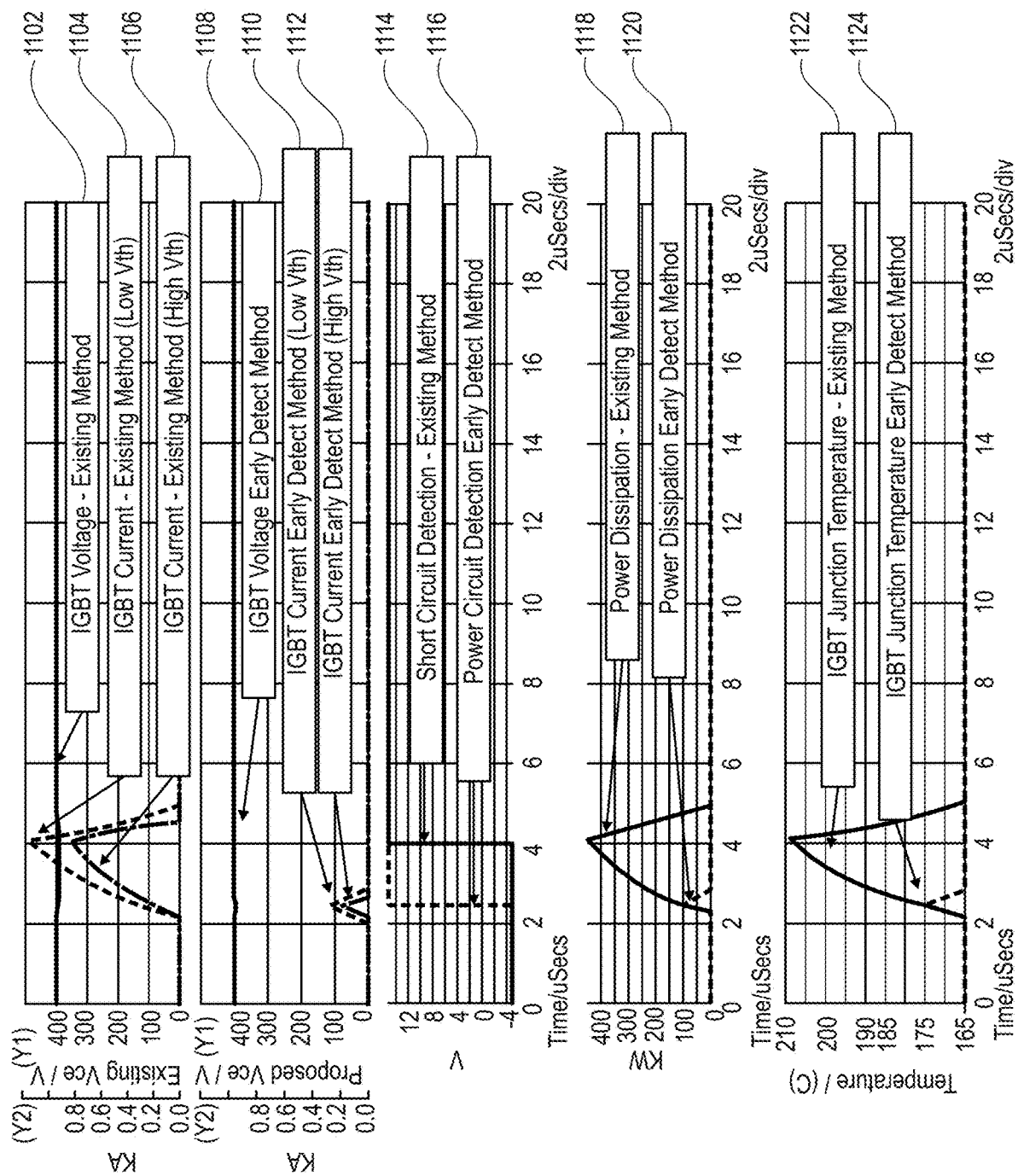

IGBT EMITTER CURRENT SENSING FOR EARLY DESATURATION DETECTION AND SHORT CIRCUIT PROTECTION

TECHNICAL FIELD

The present invention relates generally to IGBT (Insulated-Gate Bipolar Transistor) emitter current sensing for early desaturation detection and short circuit protection.

BACKGROUND

Desaturation detection utilizes the IGBT itself as a current measurement component. One or more diodes comprise a desaturation detection circuit coupled to the IGBT to monitor the IGBT collector-emitter voltage. In normal operation the collector-emitter voltage is very low (1 V to 4 V typically). However if a short circuit event occurs, the IGBT collector current increases to a level that drives the IGBT out of the saturated region and into the linear region of operation. This results in a rapid increase in the collector-emitter voltage. The above normal voltage level can be used to indicate the existence of a short circuit, and threshold levels for indicating desaturation are typically in the 7 V to 9 V region. Desaturation can also be indicated by a gate-emitter voltage that is too low, such that the IGBT is not being fully driven to the saturation region. In some cases, desaturation detection is implemented in a manner that prevents a false indication of a desaturation condition that might occur, for example, during the transition from an IGBT off state to an IGBT on state when the IGBT is not fully in the saturated state. A blanking time is generally inserted between the beginning of the turn-on signal and the point at which desaturation detection is activated in order to avoid false detection. A current source charged capacitor or an RC filter is also usually added to introduce a short time constant into the detection mechanism in order to filter spurious trips introduced by noise pickup. The selection of these filter components may take into account a trade-off between providing noise immunity and acting within the maximum time that the IGBT can withstand the short circuit condition.

SUMMARY

According to an embodiment, a gate driver system comprises a gate driver having a first input for receiving a digital input signal, a second input for receiving a short circuit protection signal, and an output for driving a power device; a current reconstruction circuit having a first input for receiving a voltage across an inductance associated with the power device, a second input for receiving a current associated with the power device, a third input for receiving the digital input signal, and an output for providing a sensed power device current; and a comparator having a first input coupled to the output of the current reconstruction circuit, a second input coupled to a reference, and an output coupled to the second input of the gate driver.

According to another embodiment, a gate driver system comprises a power device including a resistance and an inductance; a gate driver having a first input for receiving a digital input signal, a second input for receiving a short circuit protection signal, and an output for driving the power device; a current reconstruction circuit having a first input for receiving a voltage across the resistance and the inductance, a second input for receiving a current associated with the power device, a third input for receiving the digital input signal, and an output for providing a sensed power device current; and a comparator having a first input coupled to the output of the current reconstruction circuit, a second input coupled to a reference, and an output coupled to the second input of the gate driver.

According to another embodiment, a method of operating a power device comprises measuring a voltage across an inductance associated with the power device; measuring a current associated with the power device; integrating the voltage across the inductance to provide an integrated value; dividing the integrated value by an inductance value of the inductance to provide a sensed power device current; and turning off the power device if the sensed power device current is greater than a reference current.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9A, 9B, 9C, 9D, 9E, 10A, 10B, 10C, 10D, 11A, 11B, 11C, 11D, and 11E are simulated timing diagrams contrasting the detection method of the exemplary desaturation detection circuit of FIG. 1 with the detection method of the early desaturation detection circuit of FIG. 3;

DETAILED DESCRIPTION OF ILLUSTRATIVE EMBODIMENTS

According to embodiments, direct IGBT emitter current sensing across an inductance in series with the IGBT emitter is used for early desaturation detection and short circuit protection using a modified gate driver circuit. The direct emitter current sensing advantageously eliminates the diodes and blanking time associated with prior art, which enables desaturation detection and short circuit protection at a much earlier point in time so that less damage occurs to the power device over time. Early desaturation detection can thus extend the operating life of the IGBT. In embodiments, a Kelvin emitter of the IGBT can be used by the modified gate driver circuit to sense a voltage across a parasitic inductance associated with the IGBT emitter. The modified gate driver includes a calibration detection circuit for determining the value of the parasitic inductance. In embodiments, the modified gate driver circuit can provide short circuit protection for short circuit conditions that are present at turn-on (or shortly thereafter) of the IGBT as well as short circuit protection for short circuit events that develop slowly over time. Other features of gate driver circuits and gate driver systems for early desaturation detection and short circuit protection are described in further detail below with respect to certain embodiments.

Figure 1:
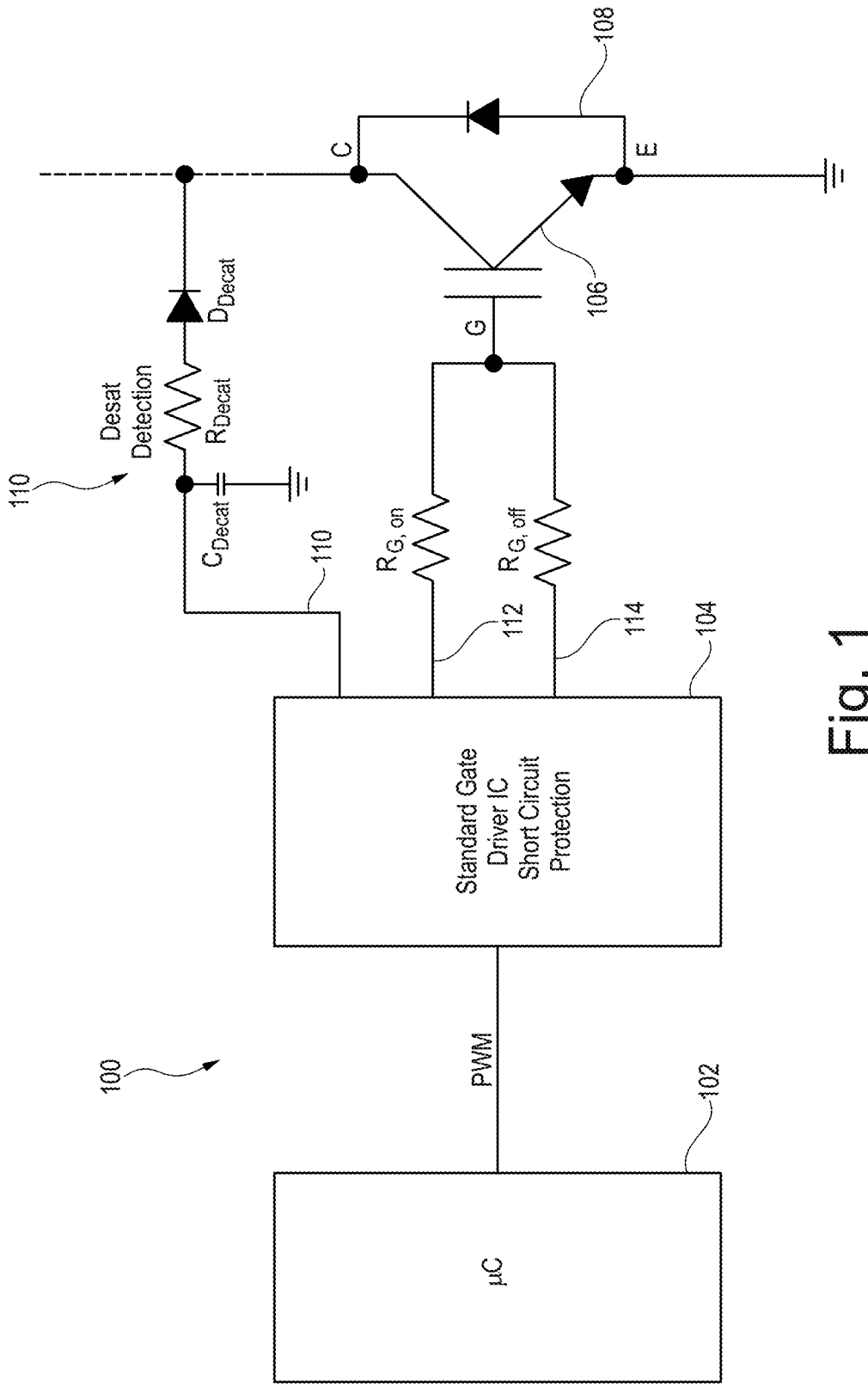
FIG. 1 is a schematic diagram of an exemplary desaturation detection circuit.

FIG. 1 is a schematic diagram of an exemplary desaturation detection circuit 100. An external microprocessor 102 or other suitable signal source generates a digital signal, such as a PWM (Pulse Width Modulation) digital signal. An input of a gate driver circuit 104 receives the PWM signal, which is boosted to appropriate voltage and current levels to drive the gate of IGBT 106 with outputs 112 and 114. A first output 112 can be used to drive the gate of IGBT 106 in an ON condition through on-resistor $R_{G,on}$ and a second output 114 can be used to drive the gate of IGBT 106 in an OFF condition through on-resistor $R_{G,off}$. IGBT 106 typically includes a freewheeling diode 108 to prevent damaging spikes occurring during turn-off when an inductive load is present. The desaturation detection circuitry typically includes a high voltage desaturation diode $D_{Desat}$ and a current limiting desaturation resistor $R_{Desat}$ coupled between the collector of IGBT 106 and the short circuit detection input no of the gate driver circuit 104. A filter capacitor $C_{Desat}$ is typically coupled between the short circuit detection input 110 of the gate driver circuit 104. The short circuit detection input no is typically an external pin of the gate driver circuit 104.

When IGBT 106 is in the OFF state due to a low PWM value, capacitor $C_{Desat}$ is held low internally by gate driver circuit 104. When IGBT 106 turns ON, due to PWM going to a high value, $C_{Desat}$ is released. Since the collector voltage of IGBT 106 is still high, $D_{Desat}$ remains reversed biased. This, in turn, results in the $C_{Desat}$ voltage rising according to the equation $T_{Blank} \times (I_{Desat}/C_{Desat})$, wherein $T_{Blank}$ is the blanking time used to prevent a false indication of a short circuit condition and $I_{Desat}$ is the current flowing through the desaturation circuitry. If IGBT 106 successfully turns ON signifying a $C_{Desat}$ voltage below approximately 8V at the end of $T_{Blank}$, no desaturation event is detected. Here, forward biased diode $D_{Desat}$ results in capacitor $C_{Desat}$ voltage of $I_{Charge} \times R_{Desat} + V_F + V_{CEon}$, wherein $I_{charge}$ is the charging current for a fully charged capacitor $C_{Desat}$, $V_F$ is the voltage across diode $D_{Desat}$, and $V_{CEon}$ is the collector-to-emitter voltage across IGBT 106 during the ON condition. If IGBT 106 does not successfully turn ON, at the end of $T_{Blank}$, a desaturation event is detected, which signifies a short circuit condition and results in the gate drive for IGBT 106 being pulled low (irrespective of PWM being high) by gate driver circuit 104.

Figures 2A, 2B, 2C, 2D:
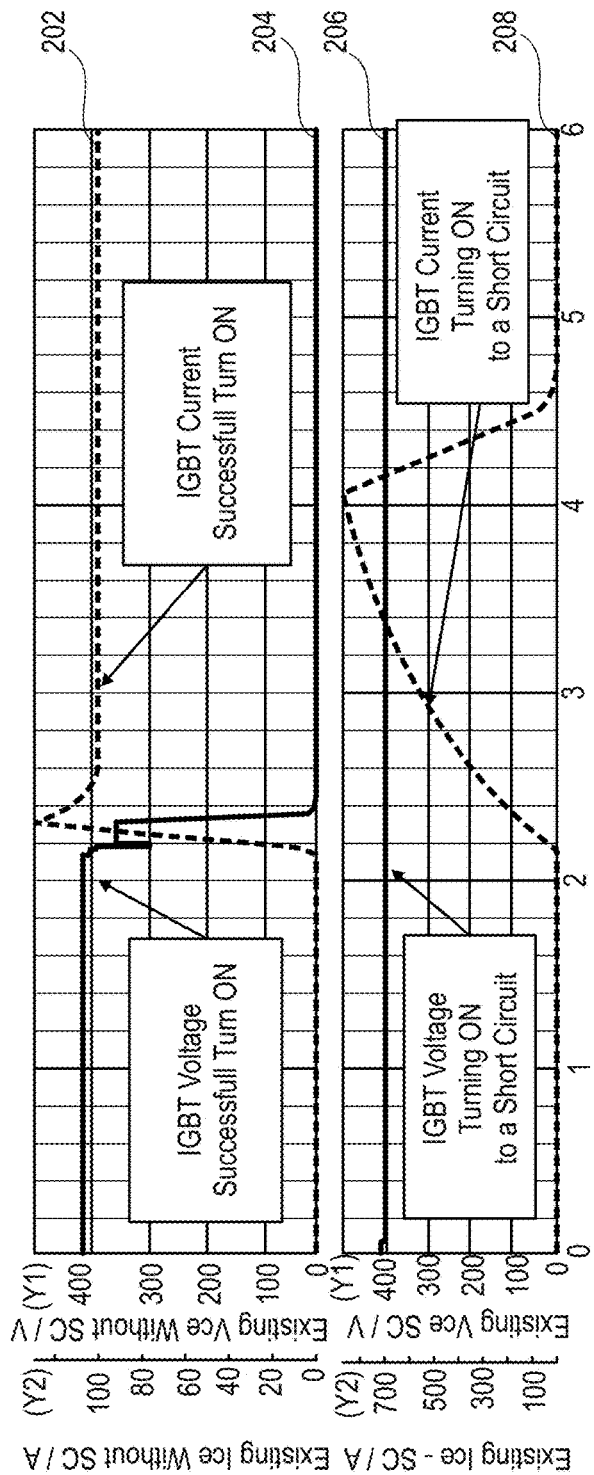
FIGS. 2A, 2B, 2C, and 2D are timing diagrams associated with the exemplary desaturation detection circuit of FIG. 1.

For the exemplary desaturation circuit 100 shown in FIG. 1, a blanking time $T_{Blank}$ is used (e.g., 2 μs) to ensure that the collector to emitter voltage $V_{CE}$ of IGBT 106 has enough time to decrease from the power bus voltage (e.g., 400V) to the fully turned ON level of $V_{CEon}$ (e.g., 1.6V) as in a successful failure free turn ON event (shown in FIG. 2A). If a failure condition does occur (shown in FIG. 2B), and the correspondingly $V_{CEon}$ is detected as a desaturation condition of IGBT (shown in FIG. 2D). A typical response of the gate driver is to pull down the gate of IGBT 106 regardless of the state of the PWM input signal. Thus the desaturation sensing circuitry 100 shown in FIG. 1 can only respond after the blanking time $T_{Blank}$ has expired (shown in FIG. 2D) which leaves the IGBT 106 vulnerable to excessive power dissipation during this period of time (shown in FIG. 2C) which can have detrimental effects on the instantaneous performance and long term reliability of the IGBT 106 due to excessive power dissipation.

FIGS. 2A, 2B, 2C, and 2D referred to above are thus timing diagrams associated with the exemplary desaturation detection circuit 100 of FIG. 1. FIG. 2A shows the IGBT current 202 and the IGBT voltage 204 during a successful turn-on event. During the successful turn-on event, the IGBT current 202 transitions from a zero current to a high current of about 100 A in the example of FIG. 2A. During the successful turn-on event the IGBT voltage 204 transitions from a high voltage of about 400 volts to a very low voltage. Note that the IGBT current 202 and the IGBT voltage 204 both exhibit spikes during the transition from the OFF condition to the ON condition. FIG. 2B shows the IGBT current 208 and the IGBT voltage 206 during a turn-on failure condition. In the example of FIG. 2B the IGBT voltage 206 does not change because it is shorted to the 400 volt power supply voltage. The IGBT current 208 increases from a low current to a peak current of about 900 A until a short circuit is detected, in which case the IGBT is turned OFF, and the current returns to the low current value. FIG. 2C shows the power dissipation comparison between the total power loss for turn-on to a short circuit 210 (relatively high with a peak power loss of about 350 kW) and the total power loss for a successful turn-on event 212 (relatively low with a peak power loss of about 50 kW). FIG. 2D shows the detection signal 214 of a desaturation event for turn-on to a short circuit, which only occurs after the blanking time $T_{Blank}$ has elapsed. After the blanking time $T_{Blank}$ has elapsed the detection signal transitions from a low value of about −5 volts to a high value of about 15 volts. In the example of FIG. 2D the detection signal can be used to turn off the IGBT once the short circuit condition has been detected.

According to embodiments, a sensing circuit and technique provides an early detection of a desaturation event or a short circuit event by directly sensing the current through the IGBT. According to embodiments, this sensing technique advantageously removes the delay associated with the blanking time $T_{Blank}$, which can significantly reduce the power dissipation in the IGBT at the onset of turning ON to a short circuit condition. As shown below in FIG. 3 and described in further detail below, the voltage change (due to di/dt) across the stray or parasitic inductance 312 of IGBT 306 (which can be between the Kelvin emitter $E_{Kelvin}$ and the Power emitter $E_{Power}$, or between the power emitter and power ground, if these terminals are provided) are measured during IGBT turn ON and integrated (for example, using an op-amp integrator) to obtain the instantaneous current level of IGBT 306. If this measured value exceeds a critical value a short circuit event is detected and the gate of IGBT 306 is pulled low. Due to the direct sensing of the current, the threshold at the input of comparator 314 can be set an appropriate lower value for safe operation. According to embodiments, this method allows for early detection of a desaturation or short circuit event of IGBT 306, which can significantly reduce the stresses imposed on IGBT 306.

Figure 3:
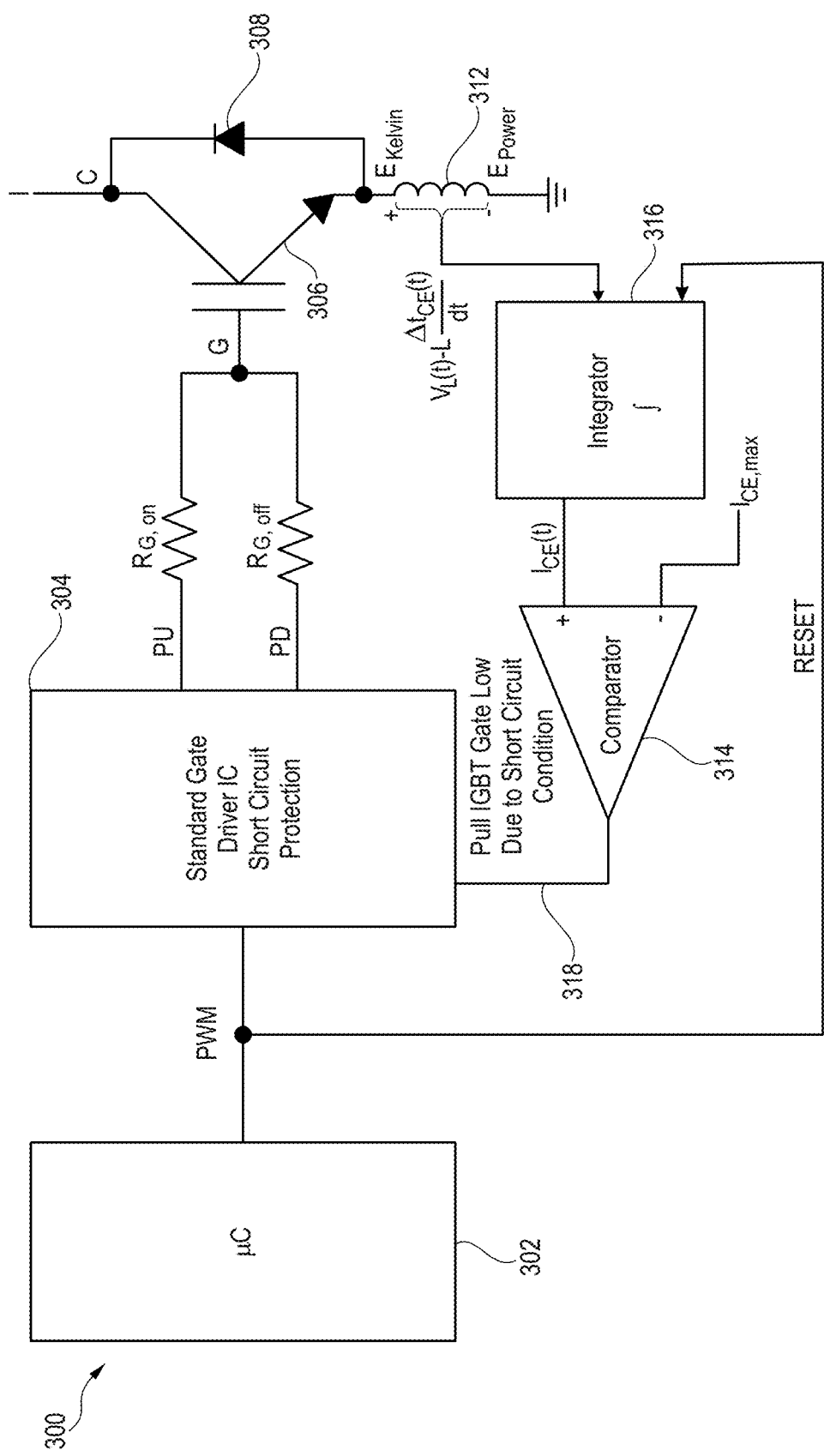
FIG. 3 is a schematic diagram of an early desaturation detection circuit according to an embodiment.

FIG. 3 is thus a schematic diagram of an early desaturation detection circuit 300 according to an embodiment. An external microprocessor 302 or other suitable signal source can be used for generating a digital signal, such as a PWM (Pulse Width Modulation) digital signal. The early desaturation detection circuit 300 can be configured for receiving an active high or an active low PWM digital signal. An input of a gate driver circuit 304 receives the PWM signal, which is boosted to appropriate voltage and current levels to drive the gate of IGBT 306 with ouputs PU and PD. A first output PU can be used to drive the gate of IGBT 306 in an ON condition through on-resistor $R_{G,on}$ n and a second output PD can be used to drive the gate of IGBT 306 in an OFF condition through on-resistor $R_{G,off}$. IGBT 306 typically includes a freewheeling diode 308 to prevent damaging spikes occurring during turn-off when an inductive load is present. Parasitic or stray inductance 312 is coupled between $E_{Kelvin}$ and $E_{Power}$. In an embodiment, inductance 312 can be only the existing bondwire inductance associated with IGBT 306, and no additional inductance need be added. In other embodiments, additional inductance internal to the IGBT package or external to the IGBT package can also be used. The voltage across inductance 312 is given by the equation $V_L(t) = L \times dI_{CE}(t)/dt$, wherein L is the inductance value of inductance 312, and $I_{CE}(t)$ is the time variant current through IGBT 306. The inductance voltage is integrated by integrator circuit 316. The output of integrator circuit 316 is thus $I_{CE}(t)$, which is representative of the current flowing through IGBT 306. In an example, comparator 314 receives a value corresponding to $I_{CE}(t)$ at the positive input thereof, and comparator 314 receives a value corresponding to a maximum allowable current $I_{CEmax}$ at the negative input thereof. The value of $I_{CEmax}$ can be set relatively low, since the blanking time $T_{Blank}$ is not used in the example of early desaturation detection circuit 300 shown in FIG. 3. The output of comparator 314 is coupled to the short circuit detection input 318 of gate driver circuit 304. The short circuit detection input 318 is typically an external pin of the gate driver circuit 304.

Figure 4:
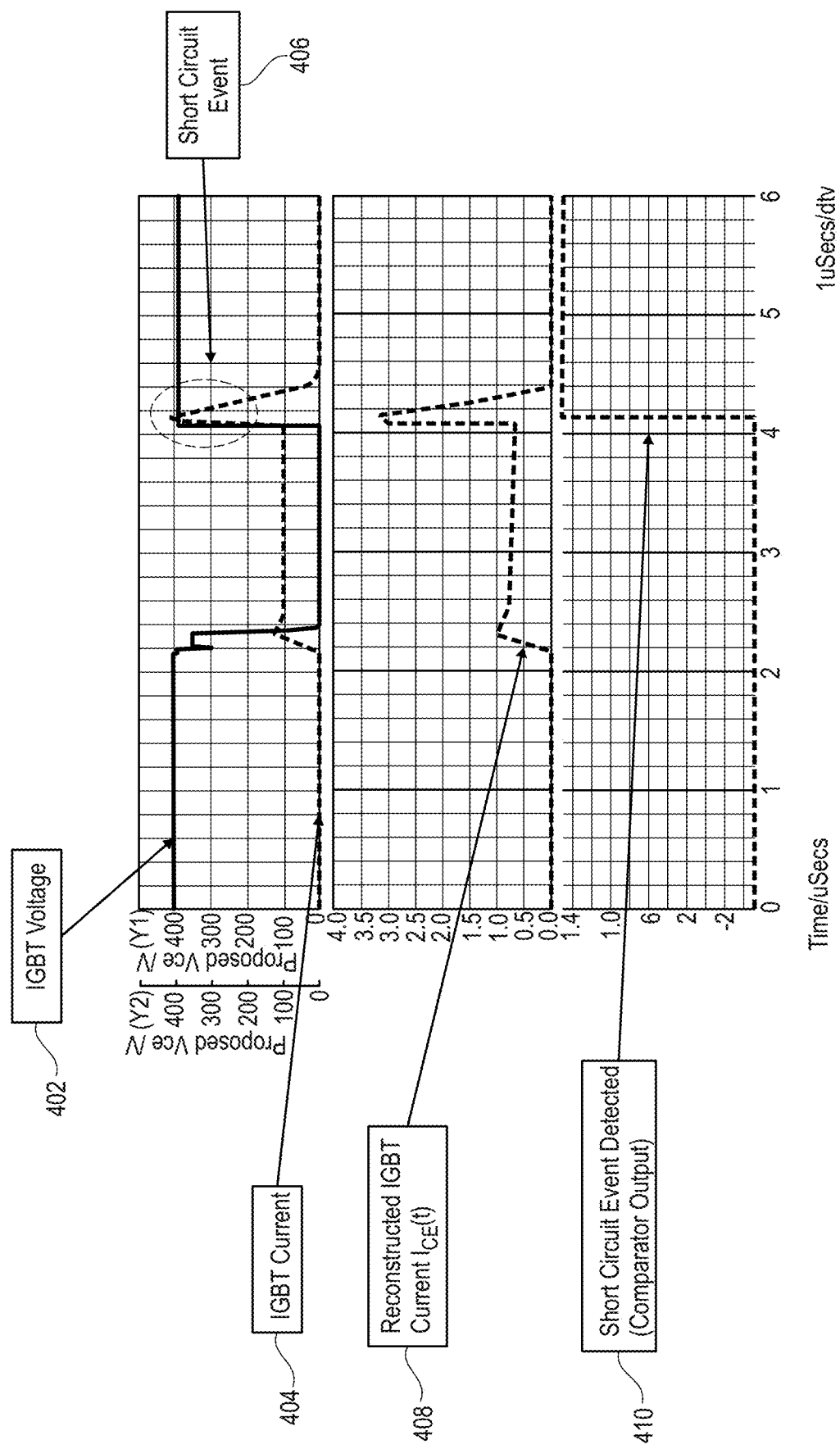
FIG. 4 is a timing diagram associated with the early desaturation detection circuit of FIG. 3.

FIG. 4 is a timing diagram associated with the early desaturation detection circuit 300 of FIG. 3. An upper portion of FIG. 4 illustrates the voltage 402 across IGBT 306, the current 404 flowing through IGBT 306, and a short circuit event 406, which causes a spike in IGBT current 404. The IGBT voltage 402 successfully transitions from a high value voltage to a low value voltage during a successful turn-on event. The IGBT voltage 402 rapidly transitions back to the high value voltage (the power supply voltage) during the subsequent short circuit event 406. The IGBT current successfully transitions from a zero current to a normal turn-on current during the successful turn-on event. The IGBT current rapidly transitions to an abnormally high short circuit current during the subsequent short circuit event 406, before returning to a zero current once the short circuit event is detected and the IGBT is turned off. A middle portion of FIG. 4 illustrates the reconstructed IGBT current 408 $I_{CE}(t)$ flowing through IGBT 306, and mirrors the IGBT current 404 shown in the upper portion of FIG. 4. A bottom portion of FIG. 4 illustrates the detected short circuit event signal 410, which is also the short circuit detection input 318 and the output of comparator 314. Detection signal 410 transitions from a low value such as −5 volts to a high value such as 15 volts once the short circuit event 406 is detected.

Figure 5:
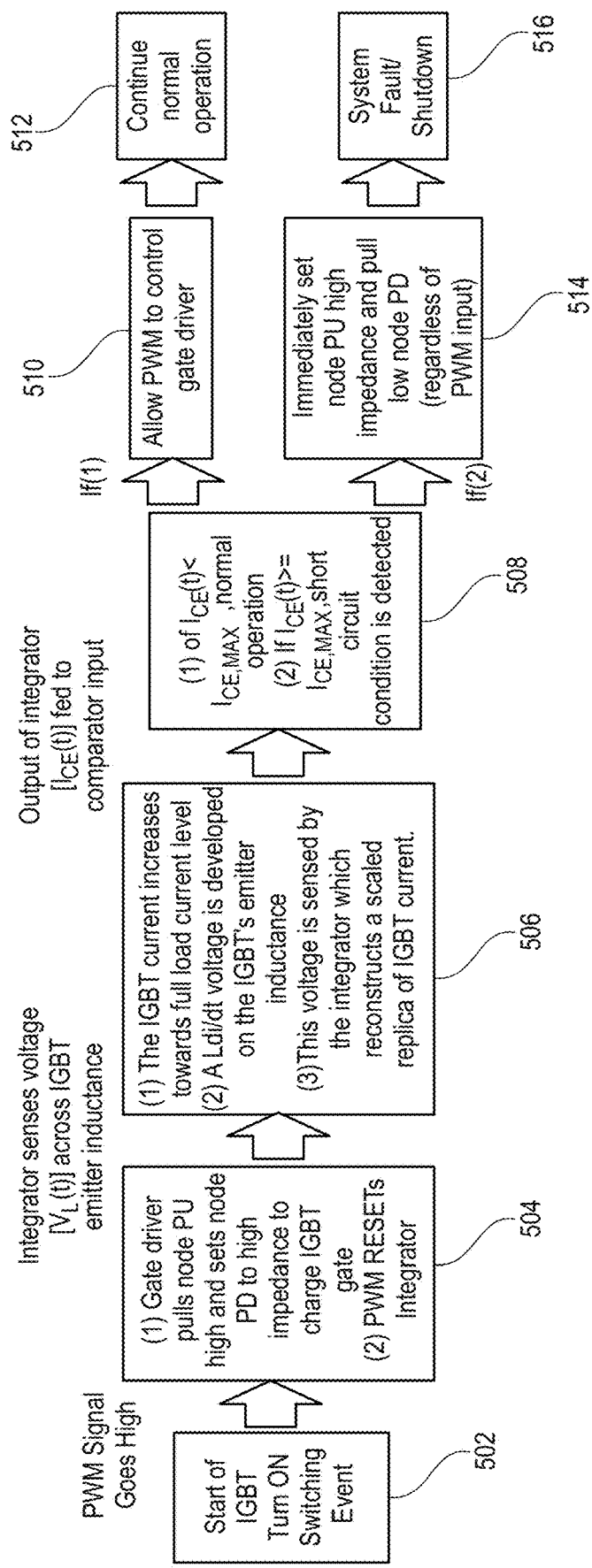
FIG. 5 is a flow chart of the method of operation of the early desaturation detection circuit of FIG. 3.

FIG. 5 is a flow chart of the method of operation of the early desaturation detection circuit 300 of FIG. 3, according to an embodiment. At step 502, the turn-on switching event of the IGBT 306 is started, wherein the PWM signal transitions to a high value. At step 504, the gate driver circuit 304 circuit pulls node PU high and sets node PD to a high impedance to charge the gate of IGBT 306. The high value of the PWM signal is also used to reset integrator circuit 316. The integrator circuit 316 thereafter senses the voltage VL(t) across the emitter inductance 312 of IGBT 306. At step 506, the current through IGBT 306 increases towards the full load current level, an L×di/dt voltage is developed on the emitter inductance 312 of IGBT 306, and this voltage is sensed by the integrator circuit 316, which reconstructs a replica of the current flowing through IGBT 306. As previously described, the output of integrator circuit 316 ($I_{CE}(t)$) is thereafter fed to the positive input of comparator 314. Step 508 determines whether a normal operating condition is detected or a short circuit condition is detected. If $I_{CE}(t)$ is less than $I_{CEmax}$, then a normal operating condition is present. If the normal operating condition is present, then the PWM input signal is allowed to control the gate driver circuit 304 at step 510, and normal operation of IGBT 306 is continued at step 512. If the short circuit condition is present, then node PU is immediately set to a high impedance, the node PD is pulled low, regardless of the value of the PWM input signal at step 514, and a system fault is generated and/or IGBT 306 is shutdown at step 516.

Figure 6:
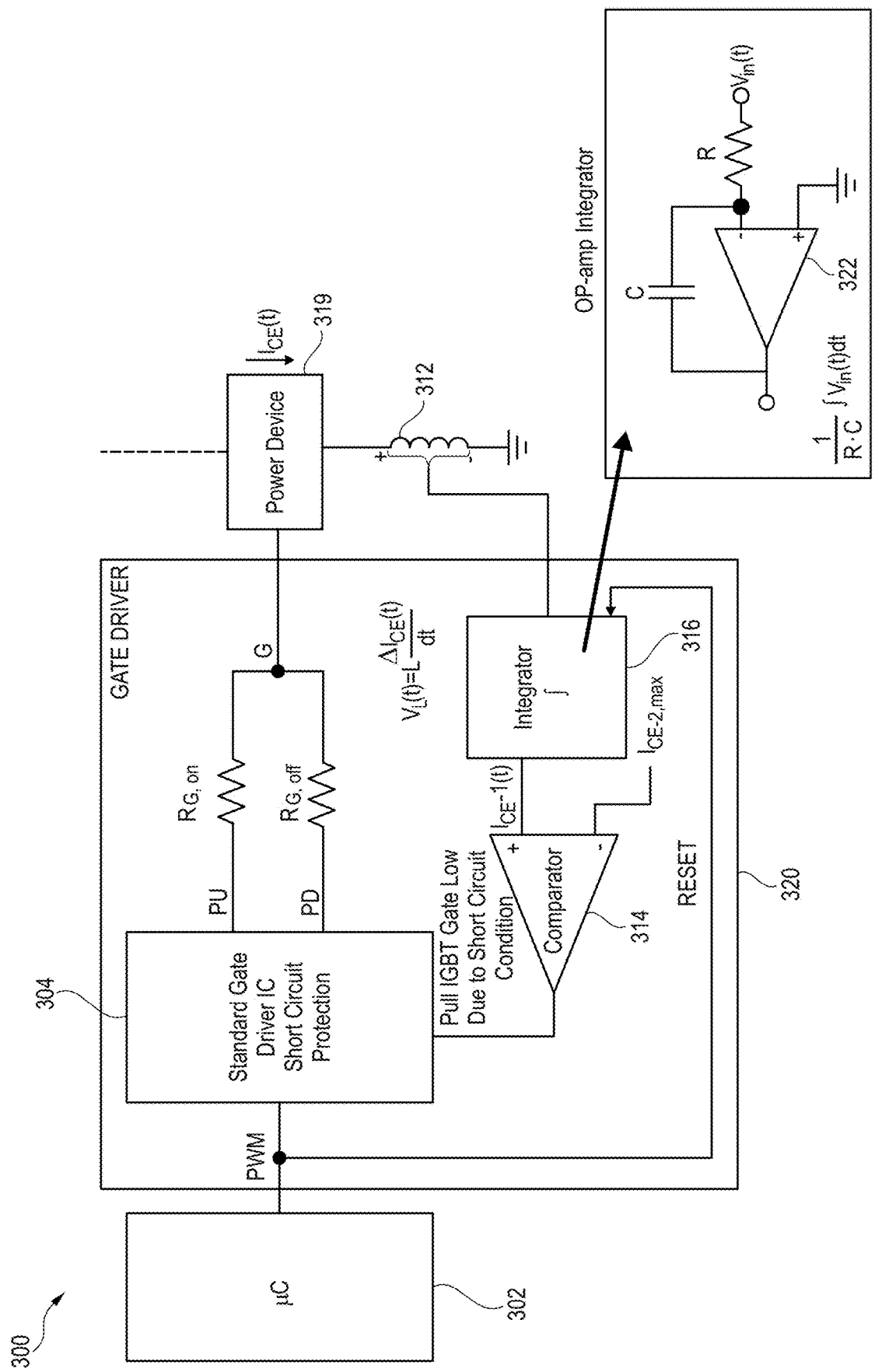
FIG. 6 is a more detailed schematic diagram of the early desaturation detection circuit of FIG. 3.

FIG. 6 is a more detailed schematic diagram of the early desaturation detection circuit 300 of FIG. 3. As previously described, early desaturation detection circuit 300 provides early desaturation detection without the use of a blanking time $T_{Blank}$, and short circuit protection for a single power device 319. As shown in FIG. 6, integrator circuit 316 can be implemented using an operational amplifier 322. In an embodiment, an input signal $V_{in}(t)$ is received by an input resistor R, which is coupled to the negative input of operational amplifier 322. A capacitor C is coupled between the negative input and the output of operational amplifier 322 to provide an integrated output signal expressed by the equation $(1/(R \times C)) \times \int V_{in}(t)dt$.

Figure 7:
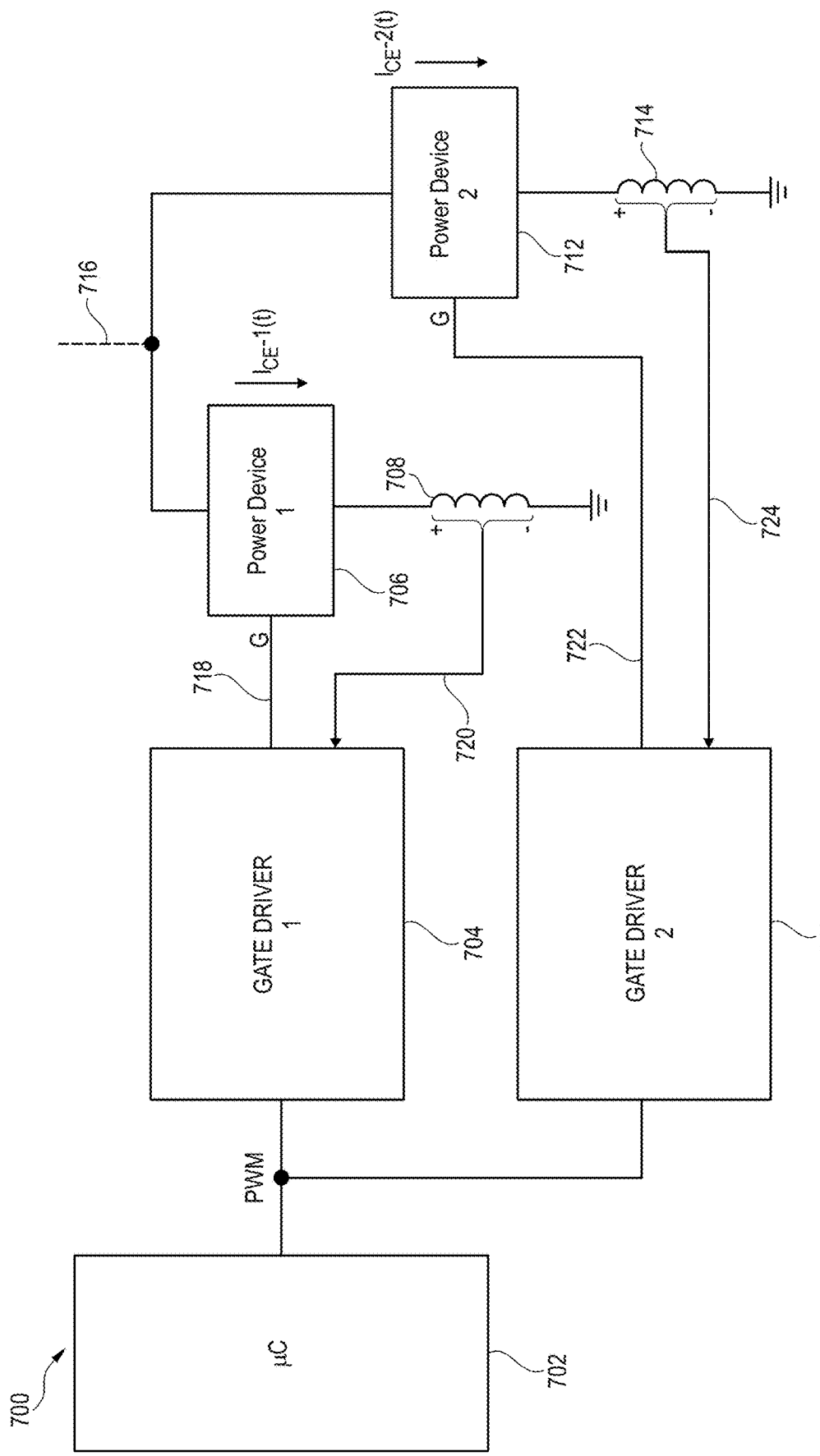
FIGS. 7 and 8 are schematic diagrams of the early desaturation detection circuit of FIG. 3 configured for driving two separate power devices.

FIG. 7 is a schematic diagram of the early desaturation detection circuit 300 of FIG. 3 configured for driving two separate power devices. Early desaturation detection circuit 700 thus provides desaturation detection and short circuit protection in a power stage when two or more power devices 706 and 712 are connected in parallel. Early desaturation detection circuit 700 is especially useful when a mismatch in current sharing exists due to process variations including variations in threshold voltage Vth, and variations in collector-to-emitter ON voltage $V_{CEon}$. In such cases, the resulting short circuit currents can be more severe than in power stages with a single power device.

Early desaturation detection circuit 700 is driven by a microprocessor 702 or other suitable signal source for providing the PWM signal to two gate driver circuits 704 and 710 of the type previously described (for example gate driver circuit 304 shown in FIG. 3). A first gate driver circuit 704 includes an output for driving the gate of a first power device 706 and includes an input for receiving the voltage across inductance 708, which may be the stray or parasitic inductance of power device 706 in an embodiment. A second gate driver circuit 710 includes an output for driving the gate of a second power device 712 and includes an input for receiving the voltage across inductance 714, which may be the stray or parasitic inductance of second power device 712 in an embodiment. The composite output current 716 includes the output current $I_{CE_1}(t)$ flowing through first power device 706 and the output current $I_{CE_2}(t)$ flowing through second power device 712.

Figure 8:
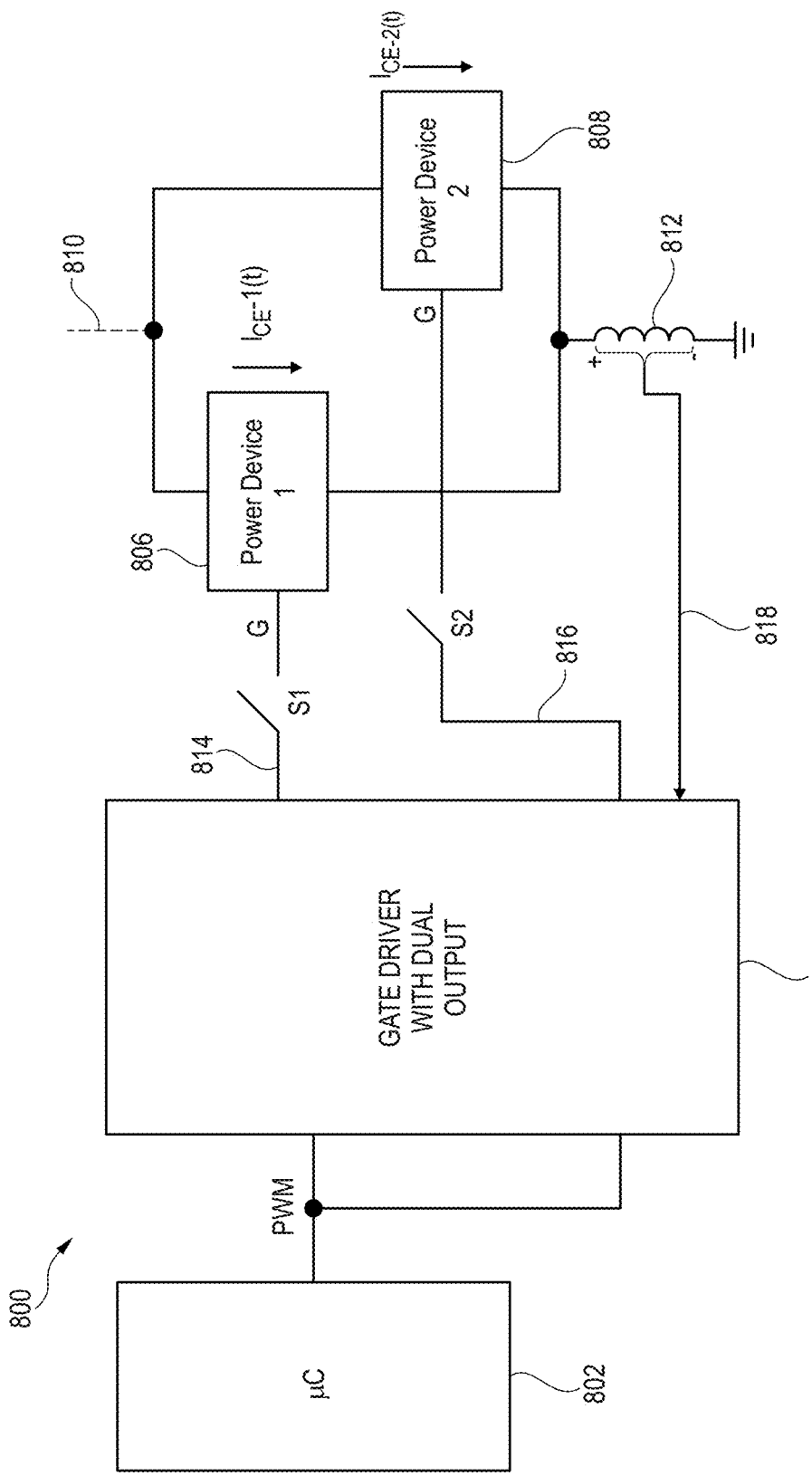

FIG. 8 is a schematic diagram of the early desaturation detection circuit 300 of FIG. 3 configured for driving two separate power devices, according to another embodiment. Early desaturation detection circuit 800 can be used for commutating current in a power stage when two or more power devices 806 and 808 are connected in parallel. For example, this method may be used when a mixture of different device types (e.g., IGBT, MOSFET, or SiC) are placed in parallel.

Early desaturation detection circuit 800 is driven by an external microprocessor 802 or other suitable signal source for providing the PWM signal to a single gate driver circuit 804 of the type previously described (for example gate driver circuit 304 shown in FIG. 3). Gate driver circuit 804 includes a first output for selectively driving the gate of a first power device 806 through switch S1, and a second output for selectively driving the gate of a second power device 808 through switch S2. Gate driver circuit 804 also includes an input for receiving the voltage across inductance 812, which may be the stray or parasitic inductance of power devices 806 and 808 in a merged packaged embodiment. Alternatively, inductance 812 can represent a discrete inductance coupled to each of power devices 806 and 808 that are separately packaged. The output current 810 can include the output current $I_{CE_1}(t)$ flowing through first power device 806 or the output current $I_{CE_2}(t)$ flowing through second power device 808 at different times depending upon the switching state of switches S1 and S2. In an embodiment, gate driver circuit 804 can be configured to have two separate outputs for providing drive voltages at outputs 814 and 816. Switches S1 and S2 can be driven by microprocessor 802 to provide the drive voltages to power devices 806 and 808 at different times. For example, switch S1 can be on (closed) during a first time period to drive the gate of power device 806, while switch S2 can be off (open) during the first time period to turn off power device 808. Alternatively, switch S1 can be off (open) during a second time period to turn off power device 806, while switch S2 can be on (closed) during the second time period to drive the gate of power device 808. In this manner, the commutating current function can be provided for use in applications in which the IGBT load is, for example, a motor.

FIGS. 9A, 9B, 9C, 9D, and 9E are simulated timing diagrams contrasting the detection method of the exemplary desaturation detection circuit 100 of FIG. 1 with the detection method of the early desaturation detection circuit 300 of FIG. 3. In particular, the timing diagrams of FIGS. 9A, 9B, 9C, 9D, and 9E illustrate the exemplary desaturation detection method and the early desaturation detection method for a power stage with a single IGBT turning ON to a short circuit condition.

Referring to FIG. 9A, for a 400V and 100 A application, the IGBT $V_{CE}$ waveform 902 and the IGBT $I_{CE}$ waveform 904 for the exemplary desaturation detection method allows the IGBT current to rise to approximately 860 A. The IGBT $I_{CE}$ waveform 904 increases for a full 2 μs due to the corresponding blanking time of 2 μs. At about 4 μs, desaturation detection and short circuit detection occurs consequently pulling the gate of the IGBT low. The IGBT $I_{CE}$ waveform decreases to zero at about 4.5 μs since the IGBT is turned off. The blanking time extends from about 2 μs to 4 μs in FIGS. 9A, 9C, 9D, and 9E.

Referring to FIG. 9B, for a similar condition, the IGBT $V_{CE}$ waveform 906 and the IGBT $I_{CE}$ waveform 908 for the early desaturation detection method (with no blanking time) allows the IGBT current to rise to only approximately 243 A at 2.5 μs immediately prior to the desaturation detection and short circuit detection consequently pulling the gate of the IGBT low.

Referring to FIG. 9C, the short circuit detection waveform 910 for the exemplary desaturation detection method and the short circuit detection waveform 912 for the early desaturation detection method are shown. Note that the exemplary desaturation detection method detects a short circuit at about 4 μs (due to the inclusion of a blanking time between 2 μs and 4 μs), whereas the early desaturation detection method detects a short circuit earlier at about 2.5 μs.

Referring to FIG. 9D, the exemplary desaturation detection power dissipation waveform 914 and the early desaturation detection power dissipation waveform 916 are shown. As shown in FIG. 9D, the early desaturation detection method results in approximately 72% reduction in instantaneous IGBT power dissipation when compared to the exemplary desaturation detection method from about 349 kW at 4 μs to about 98 kW at 2.5 μs.

Referring to FIG. 9E, the exemplary desaturation detection IGBT junction temperature waveform 918 and the early desaturation detection IGBT junction temperature waveform 920 are shown. If a typical thermal configuration is assumed for the IGBT is considered, this power dissipation combined with the junction to ambient transient thermal impedance ($Z_{thj-a}$) of the IGBT results in an approximate 25° C. reduction in IGBT junction temperature from the peak of waveform 918 (200° C. at 4 μs) to the peak of waveform 920 (175° C. at 2.5 μs).

FIGS. 10A, 10B, 10C, and 10D are simulated timing diagrams contrasting the detection method of the exemplary desaturation detection circuit of FIG. 1 with the detection method of the early desaturation detection circuit of FIG. 3. In particular, FIGS. 10A, 10B, 10C, and 10D illustrate a short circuit condition occurring after the blanking time has expired during conduction of a single IGBT. If a short circuit condition occurs during IGBT conduction, a desaturation condition or short circuit condition is detected and the gate driver pulls the IGBT gate low regardless of the state of the PWM signal.

FIG. 10A shows the PWM signal 1002, which is a digital input signal for controlling the conduction of the IGBT for both the exemplary desaturation detection method and the early desaturation detection method. The PWM signal is high during the short circuit event. The PWM signal is high (5 volts) from 2 μs to 8 μs and from 12 μs to 18 μs. The PWM signal is low (zero volts) from zero to 2 μs, from 8 μs to 12 μs, and from 18 μs to 20 μs.

FIG. 10B shows the IGBT voltage waveform 1004 and the IGBT current waveform 1006 for the exemplary desaturation detection method. The IGBT voltage waveform 1004 transitions low during a successful turn-on event at 2 μs. The IGBT voltage waveform 1004 rapidly transitions high during a subsequent short circuit condition at 4 μs. The IGBT current waveform 1006 transitions from a zero value current to a normal value current during the successful turn-on event at 2 μs. The IGBT current waveform 1006 rapidly increases to a short circuit current value of about 400 A during the subsequent short circuit condition at 4 μs, and falls to zero current shortly thereafter once the short circuit condition has been detected and the IGBT has been turned off.

FIG. 10C shows the voltage waveform 1008 and the IGBT current waveform 1010 for the early desaturation detection method. Both current waveforms show a current spike occurring after the blanking time (from 2 μs to 4 μs) has expired, and thus both sets of current and voltage waveforms in FIGS. 10B and 10C are very similar.

FIG. 10D show the short circuit detection waveform 1012 for the exemplary desaturation detection method and the short circuit detection waveform 1014 for the early desaturation detection method that traverses from a logic low level to a logic high level when the short circuit condition is detected. Note that detection waveforms 1012 for the exemplary desaturation detection method and 1014 for the early desaturation detection method are also very similar in performance.

The simulation results of FIGS. 10A, 10B, 10C, and 10D show that both the exemplary and early desaturation detection methods provide similar performance since the short circuit condition occurred after the blanking time had expired.

FIGS. 11A, 11B, 11C, 11D, and 11E are simulated timing diagrams contrasting the detection method of the exemplary desaturation detection circuit of FIG. 1 with the detection method of the early desaturation detection circuit of FIG. 3. In particular, FIGS. 11A, 11B, 11C, 11D, and 11E show w parallel IGBTs turning ON to a short circuit condition. In the example of FIGS. 11A, 11B, 11C, 11D, and 11E the threshold voltage of the paralleled devices are approximately 4 V and approximately 6.5 V respectively, which results in unequal current sharing during IGBT turn on.

Referring to FIG. 11A, the IGBT voltage waveform 1102, the low $V_{th}$ IGBT current waveform 1104, and the high $V_{th}$ IGBT current waveform 1106 are shown for the exemplary desaturation detection method. For a 400V and 200 A application, the existing method (due to a blanking time of 2 μs from 2 μs to 4 μs) allows the maximum IGBT current to rise to approximately 1142 A prior to the desaturation or short circuit detection and consequently pulling the gate of the IGBT low.

Referring to FIG. 11B, the IGBT voltage waveform 1108, the low $V_{th}$ IGBT current waveform 1110, and the high $V_t$h IGBT current waveform 1112 are shown for the early desaturation detection method. For a similar condition, the early desaturation detection system only allows a maximum current through an IGBT to rise to approximately 258 A.

Referring to FIG. 11C, the exemplary short circuit detection waveform switches at about 4 μs after the short circuit event, whereas the early short circuit detection waveform switches about 2.5 μs after the short circuit event, which occurred at 2 μs.

Referring to FIG. 11E, the IGBT junction temperature waveform 1122 is shown for an IGBT associated with the exemplary desaturation detection method, and the IGBT junction temperature waveform 1124 is shown for an IGBT associated with the early desaturation detection method. As shown in FIG. 11E, the early desaturation detection method results in approximately 77% reduction in instantaneous IGBT power dissipation from approximately 448 kW to approximately 103 kW. If a typical thermal configuration is considered, this power dissipation combined with the junction to ambient transient thermal impedance ($Z_{thj-a}$) of the IGBT results in an approximate 35° C. reduction in IGBT junction temperature (210° C. to 175° C.).

Figure 12:
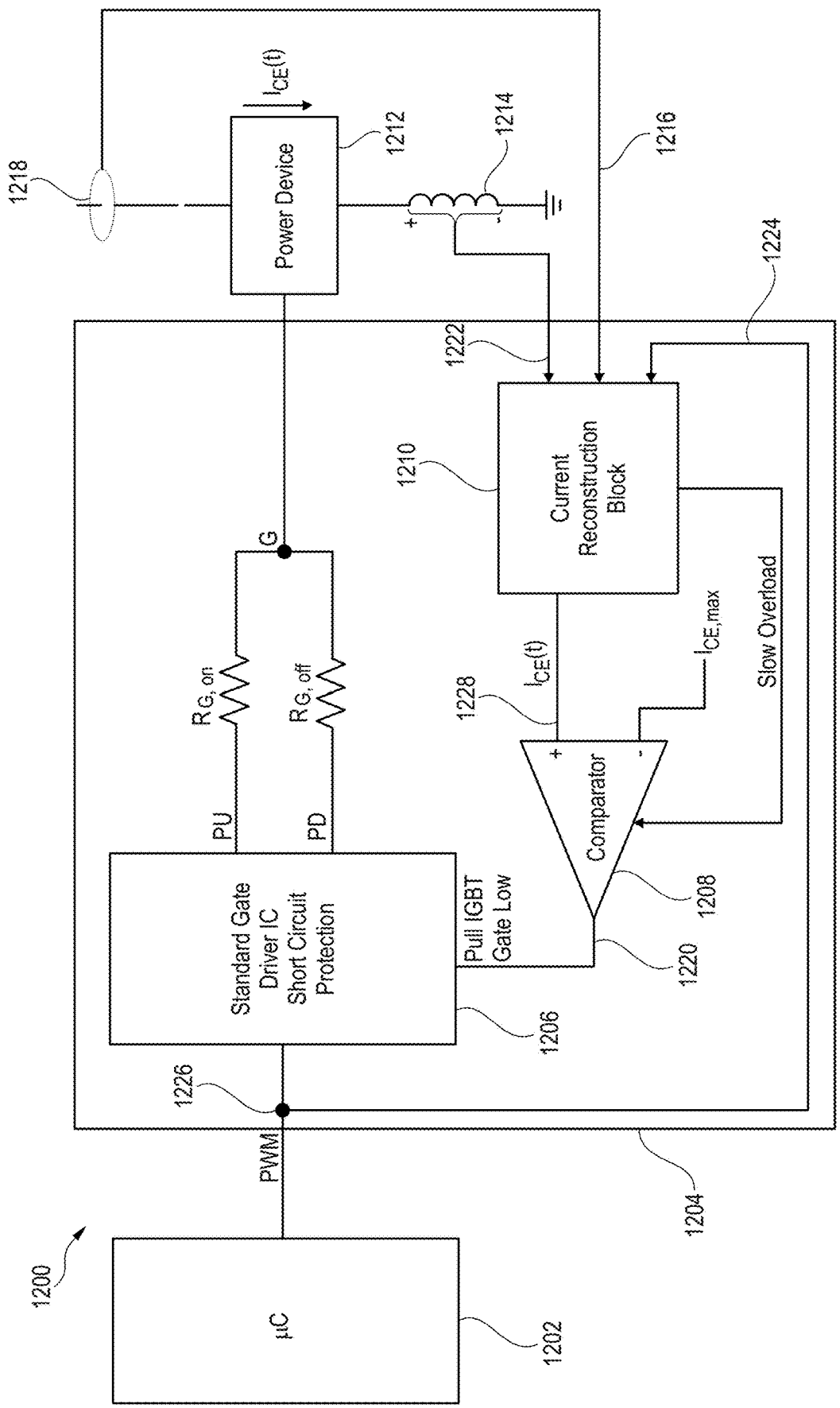
FIG. 12 is a schematic diagram of an early desaturation detection circuit according to another embodiment.

FIG. 12 is a schematic diagram of an early desaturation detection circuit 1200 according to another embodiment. Short circuit and slow overload protection for a single power device 1212 are provided. The early desaturation detection circuit 1200 can be implemented as a gate driver system 1204 including a standard gate driver 1206 integrated circuit having short circuit protection through, for example a second input 1220, which is a dedicated short circuit protection pin. The gate driver system 1204 can include discrete components to provide the direct current sensing function, or they can be integrated together with gate driver 1206. The gate driver system 1204 can include a discrete power device 1212 having a stray or parasitic inductance 1214. The discrete power device 1212 can be a four-terminal power device with a Kelvin power terminal such as a Kelvin emitter. The power device 1212 can also be integrated together with the gate driver 1206 and the other components shown in FIG. 12 in an embodiment, if desired.

Figure 13:
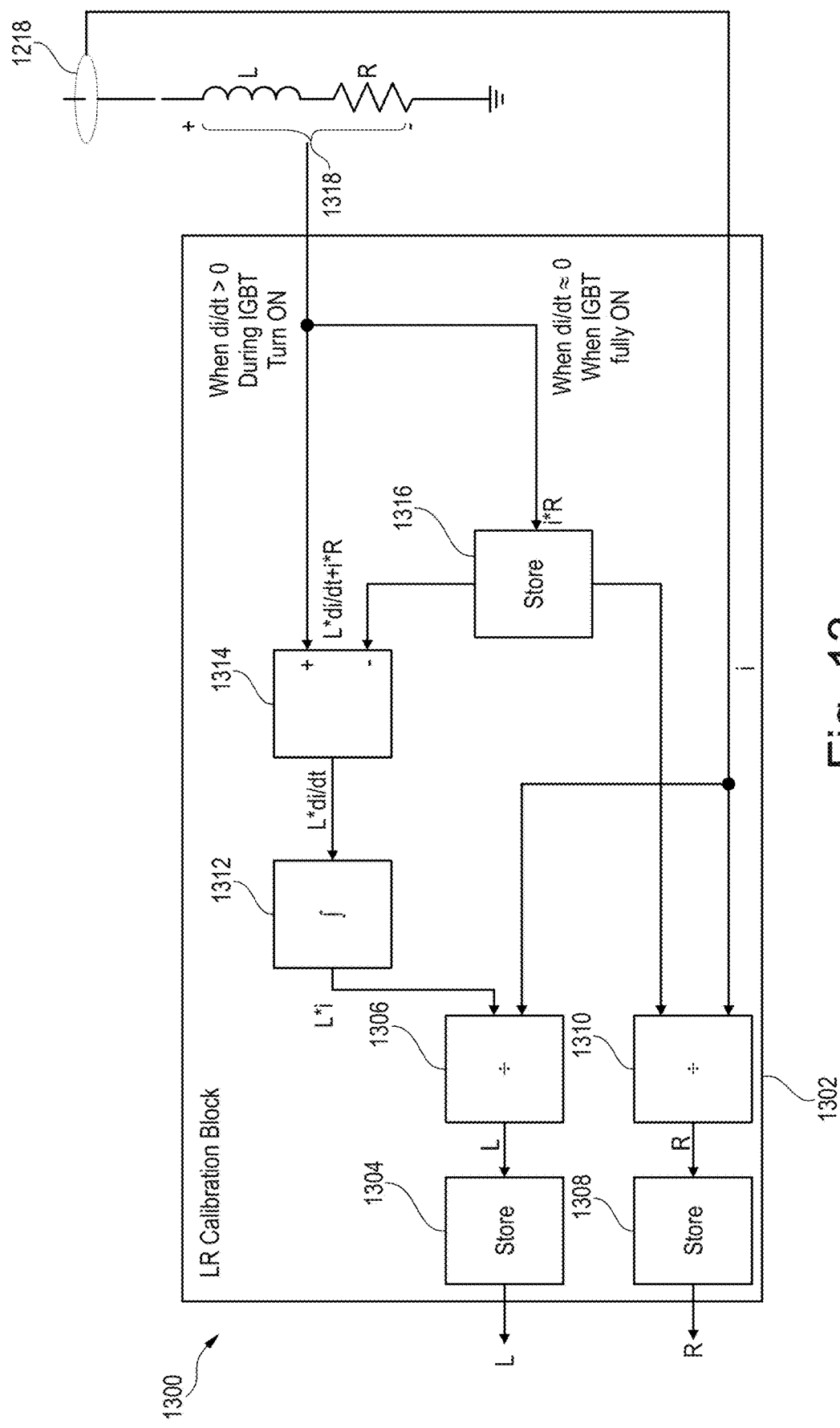
FIG. 13 is a schematic diagram of a calibration circuit associated with the early desaturation detection circuit of FIG. 12.

The gate driver system 1204 shown in FIG. 12 comprises a gate driver 1206 having a first input 1226 for receiving a digital input signal, which can be a PWM signal in an embodiment, a second input 1220 for receiving a short circuit protection signal, and output including terminals or pins PU and PD for driving the power device 1212. A current reconstruction circuit 1210 has a first input 1222 for receiving a voltage across the inductance 1214 associated with the power device 1212, a second input 1216 for receiving a current associated with the power device 1212, a third input 1224 for receiving the PWM digital input signal, and an output 1228 for providing a sensed power device current $I_{CE}(t)$. In an embodiment, the current associated with the power device 1212 can be provided by a current detector or current sensing circuit 1218, which can comprise, for example, a current mirror sensing circuit, a shunt resistor sensing circuit, or any other known sensing circuit arrangements. In an embodiment, the sensed current need only be sensed once in a calibration operation, which is also used to determine the value of inductance 1214, which will be explained in further detail below. Gate driver system 1204 also comprises a comparator 1208 having a first input (positive input) coupled to the output 1228 of the current reconstruction circuit 1210, a second input (negative input) coupled to a reference ($I_{CEmax}$), and an output coupled to the second input 1220 of the gate driver 1206, wherein the current reconstruction circuit 1210 comprises a calibration circuit (not specifically shown in FIG. 12) for determining an inductance value of inductance 1214 associated with the power device. The calibration circuit is shown in FIG. 13 and described in further detail below. In an embodiment, the calibration circuit is also configured for determining a resistance value associated with the power device, which is also described in further detail below.

FIG. 13 is a schematic diagram of a calibration circuit 1300 associated with the early desaturation detection circuit 1200 of FIG. 12. Calibration circuit 1300 performs a calibration method that determines the L and R values of the inductance L and the resistance R associated with the power device (not shown in FIG. 13). The calibration method is performed during power stage startup in an embodiment, and the L and R values are stored in memory inside the calibration circuit.

Calibration circuit 1300 comprises a summing circuit 1300 having a first input (positive input) for receiving a voltage 1318 across the inductance L and resistance R at a first time in the calibration sequence. Summing circuit 1300 has a second input (negative input) for receiving voltage 1318 across the inductance L and resistance R at a second time in the calibration sequence, through memory 1316. Calibration circuit 1300 also comprises an integrator circuit 1312 having an input coupled to the output of the summing circuit 1314. Calibration circuit 1300 also comprises a first divider circuit 1306 having a first input coupled to the output of the integrator circuit 1312, a second input for receiving a current value from current sensing circuit 1218, and an output for providing the inductance value L; and a second divider circuit 1310 having a first input for receiving the second voltage from memory 1316, a second input for receiving a current value from current sensing circuit 1218, and an output for providing the resistance value R. The inductance value L may be stored in memory 1304, and the resistance value R may be stored in memory 1308, in an embodiment.

In an embodiment, the first voltage comprises a voltage corresponding to a positive change in current through the inductance and the resistance, having a value of $L*di/dt+i*R$. This value can be determined at a first time during the calibration sequence when the power device is just turning on and the current through the power device is increasing. In an embodiment, the second voltage comprises a voltage corresponding to a zero change in current through the inductance and the resistance, having a value of $i*R$. This value can be determined at a second time during the calibration sequence when the power device if fully turned on and has reached a stable ON current.

The values of L and R can be determined once, for example at the time of manufacture. In other embodiments, the values of L and R can be updated as desired throughout the lifetime of the early desaturation detection circuit 1200 to compensate for any changes that may occur to those values through usage.

Figure 14:
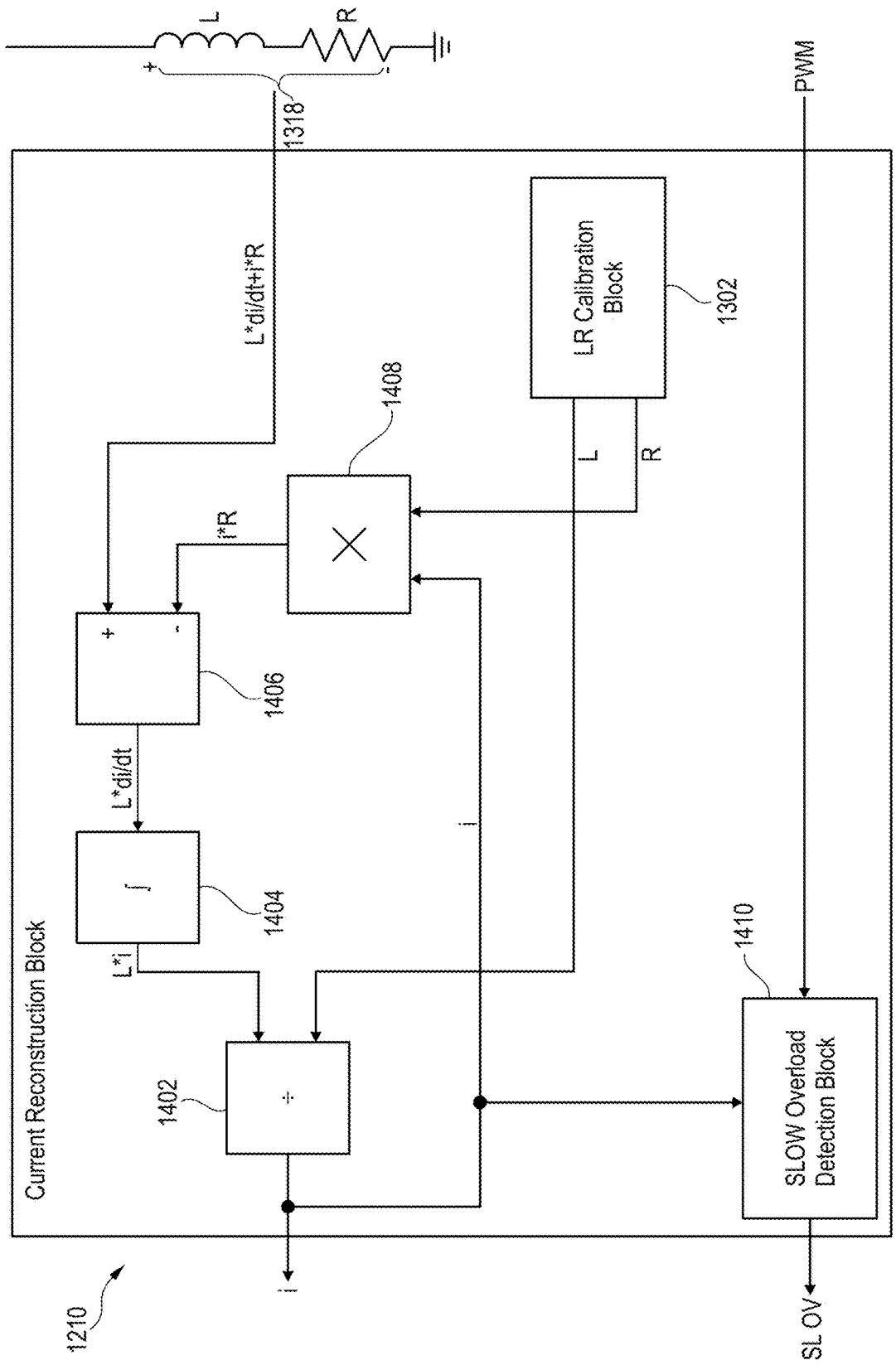
FIG. 14 is a schematic diagram of a current reconstruction circuit associated with the early desaturation detection circuit of FIG. 12.

FIG. 14 is a schematic diagram of a current reconstruction circuit 1210 associated with the early desaturation detection circuit 1200 of FIG. 12. Current reconstruction circuit 1210 provides a method for current reconstruction of the current "i" flowing through the power device using the previously determined L and R values.

Current reconstruction circuit 1210 comprises a summing circuit 1406 having a first input (positive input) for receiving the voltage 1318, a second input (negative input), and an output. In an embodiment, the voltage at the first input has a value of $L*di/dt+i*R$, the voltage at the second input has a value of $i*R$, and the voltage at the output has a value of $L*di/dt$. An integrator circuit 1404 is coupled to the output of the summing circuit 1406. In an embodiment, the output of integrator circuit 1404 has a value of $L*i$. Current reconstruction circuit 1210 also comprises a divider circuit 1402 having a first input coupled to the output of the integrator circuit 1404, a second input for receiving the inductance value L from the calibration circuit 1302, and an output for providing the reconstructed current flowing through the power device. Current reconstruction circuit also comprises a multiplier circuit 1408 having a first input for receiving the reconstructed current, a second input for receiving the resistance value R from the calibration circuit 1302, and an output coupled to the second input of the summing circuit 1406. In an embodiment, the current reconstruction circuit 1210 further comprises an optional slow overload detection circuit 1410 for receiving the reconstructed power device current, the PWM signal, and for providing a slow overload signal SL OV, which is described in further detail below with reference to FIG. 15.

Figure 15:
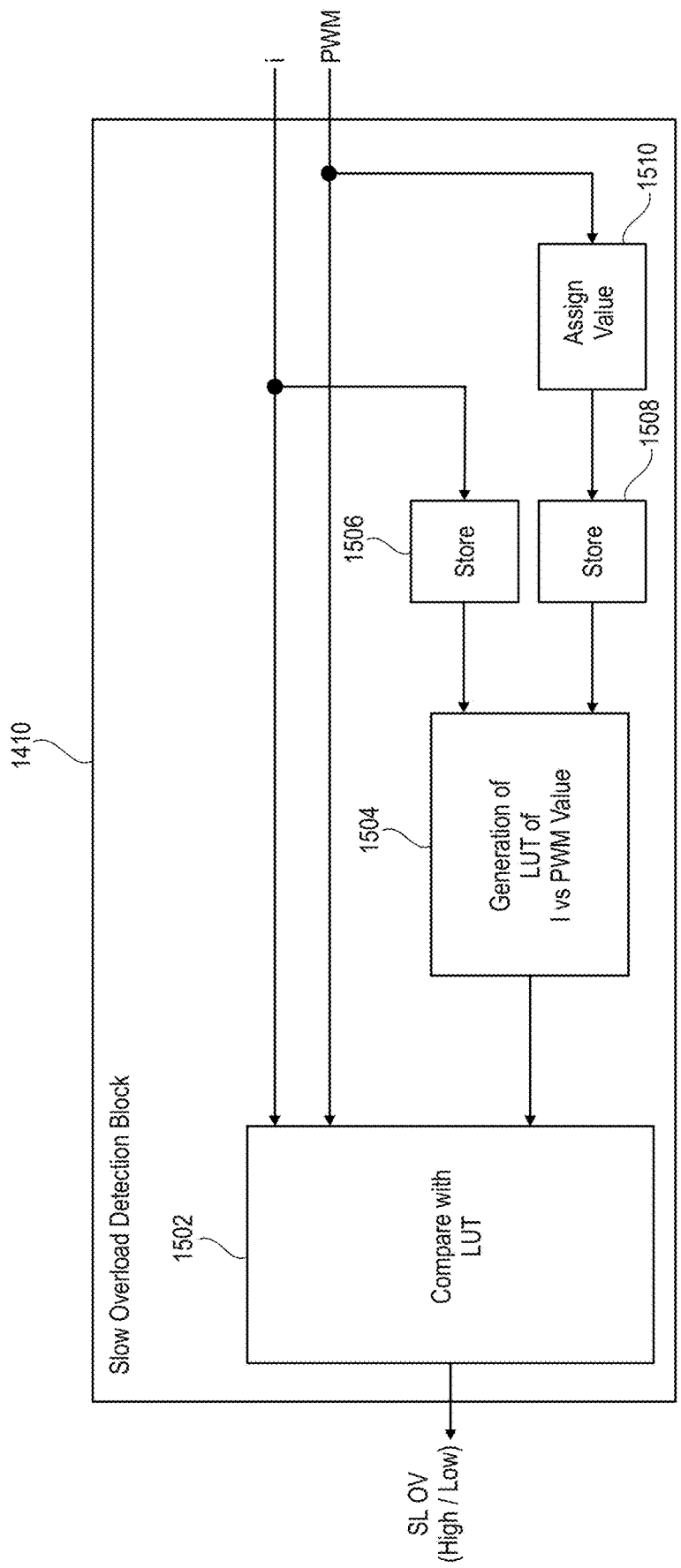
FIG. 15 is a schematic diagram of a slow overload detection circuit associated with the early desaturation detection circuit of FIG. 12.

FIG. 15 is a schematic diagram of a slow overload detection circuit 1410 associated with the early desaturation detection circuit 1200 of FIG. 12. Slow overload detection circuit 1410 provides a method for slow overload detection that develops gradually over time as contrasted with an initial short circuit condition, or a short circuit spike or pulse or other short circuit condition that occurs shortly after turn on of the power device. A lookup table (LUT) based on the stored values for the reconstructed power device current and the associated PWM state (assigned value) is generated. When a new reconstructed current is generated during operation, it is compared with the historically expected value in the LUT to determine if a slow overload condition is present. If a slow overload condition exists (for example in the new value is above an allowable threshold over the historical value), the slow overload signal SL OV goes high and shuts down IGBT power device. The slow overload can be due to IGBT or load degradation over several switching and/or fundamental cycles (if, for example, the load is an electric machine).

In an embodiment, the slow overload detection circuit 1410 comprises a first input for receiving the reconstructed power device current, a second input for receiving the PWM signal, and an output for providing a slow overload detection signal SL OV. The reconstructed current values are stored in memory 1506, and the PWM assigned values 1510 are stored in memory 1508. The stored values are used to generate a lookup table 1504 including historical values of reconstructed current vs PWM value during normal operation of the power device. In addition, current values of the reconstructed power device current and the PWM signal are received by a comparator 1502. Comparator 1502 compares the current values with the historical values to generate the SL OV slow overload signal. In an embodiment, the SL OV signal can be a digital output signal. The comparator 1502 can directly compare the historical values to the current values and generate the SL OV. In an embodiment, comparator 1502 can be configured to generate the SL OV only if the comparison is greater than a predetermined allowable threshold value.

Advantages of the early desaturation detection circuit and method described herein include direct sensing and reconstruction of the IGBT power device current without using IGBT power device voltage as a proxy for the current flowing through the power device as in existing techniques.

It is a further advantage of the early desaturation detection circuit and method that it provides early detection of an IGBT desaturation and short circuit event, when compared to other techniques requiring a blanking time.

It is a further advantage of the early desaturation detection circuit and method that a significant reduction in power dissipation and a correspondingly significant reduction in the IGBT junction temperature can be realized, which reduces stresses that degrade the instantaneous performance and long term reliability of the IGBT power device. The early desaturation detection circuit described herein thus advantageously improves the electro-mechanical reliability of the IGBT power device.

It is a further advantage of the early desaturation detection circuit and method that it does not introduce any new sensing elements to the existing power stage as the primary sensing element. The early desaturation detection circuit and system advantageously uses the emitter stray inductance of the IGBT power device, which can be either the already existing stray inductance between the Kelvin emitter and the power emitter or any other terminals or contact points in the IGBT power device emitter current path.

It is a further advantage of the early desaturation detection circuit and method that the IGBT current can be sensed without need for a special current sense IGBT silicon chip technology, which significantly reduces manufacturing processes and associated costs.

It is a further advantage of the early desaturation detection circuit and method that the external components associated with previous desaturation detection methods and circuits such as the high voltage diode ($D_{Desat}$), the current limiting resistor ($R_{Desat}$) and the capacitance ($C_{Desat}$) can be eliminated, which significantly reduces system cost.

It is a further advantage of the early desaturation detection circuit and method that the integrator and comparator functions can be easily integrated into existing standard gate driver IC technologies. For example, if realized in a gate driver IC, only one additional pin is required for the sensing of the voltage across the stray inductance at the IGBT Kelvin emitter. Thus, existing applications can benefit from the early desaturation detection method with only a change in the gate driver IC.

A further advantage of the early desaturation detection circuit and method is that, since the short circuit time of an IGBT power device is proportional to its corresponding $V_{CEon}$ and switching losses, IGBT power devices with smaller short circuit times can be utilized which reduces both conduction and switching losses of the IGBT. In an embodiment, the reduced power dissipation advantageously allows implementation of either silicon chips with smaller active silicon areas or lower junction temperatures.

Example embodiments of the present invention are summarized here. Other embodiments can also be understood from the entirety of the specification and the claims filed herein.

Example 1. A gate driver system comprises a gate driver having a first input for receiving a digital input signal, a second input for receiving a short circuit protection signal, and output for driving a power device; a current reconstruction circuit having a first input for receiving a voltage across an inductance associated with the power device, a second input for receiving a current associated with the power device, a third input for receiving the digital input signal, and an output for providing a sensed power device current; and a comparator having a first input coupled to the output of the current reconstruction circuit, a second input coupled to a reference, and an output coupled to the second input of the gate driver.

Example 2. The gate driver system of example 1, wherein the current reconstruction circuit comprises a calibration circuit for determining an inductance value associated with the power device.

Example 3. The gate driver system of any of the above examples, wherein the calibration circuit is also configured for determining a resistance value associated with the power device.

Example 4. The gate driver system of any of the above examples, wherein the current reconstruction circuit comprises a summing circuit having a first input coupled to the first input of the current reconstruction circuit, a second input, and an output; an integrator circuit coupled to the output of the summing circuit; a divider circuit having a first input coupled to the output of the integrator circuit, a second input for receiving the inductance value from the calibration circuit, and an output coupled to the output of the current reconstruction circuit; and a multiplier circuit having a first input coupled to the output of the current reconstruction circuit, a second input for receiving the resistance value from the calibration circuit, and an output coupled to the second input of the summing circuit.

Example 5. The gate driver system of any of the above examples, wherein the calibration circuit comprises a summing circuit having a first input for receiving a first voltage from the first input of the current reconstruction circuit, a second input for receiving a second voltage from the first input of the current reconstruction circuit, and an output; an integrator circuit having an input coupled to the output of the summing circuit, and an output; a first divider circuit having a first input coupled to the output of the integrator circuit, a second input coupled to the second input of the current reconstruction circuit, and an output for providing the inductance value; and a second divider circuit having a first input for receiving the second voltage from the first input of the current reconstruction circuit, a second input coupled to the second input of the current reconstruction circuit, and an output for providing the resistance value.

Example 6. The gate driver system of any of the above examples, wherein the first voltage from the first input of the current reconstruction circuit comprises a voltage corresponding to a positive change in current through the inductance and the resistance.

Example 7. The gate driver system of any of the above examples, wherein the second voltage from the first input of the current reconstruction circuit comprises a voltage corresponding to a zero change in current through the inductance and the resistance.

Example 8. The gate driver system of any of the above examples, wherein the current reconstruction circuit further comprises a slow overload detection circuit.

Example 9. The gate driver system of any of the above examples, wherein the slow overload detection circuit comprises a first input coupled to the output of the current reconstruction circuit, a second input coupled to the third input of the current reconstruction circuit, and an output for providing a slow overload detection signal.

Example 10. The gate driver system of any of the above examples, wherein the output of the slow overload detection circuit is coupled to the comparator of the current reconstruction circuit.

Example 11. The gate driver system of any of the above examples, wherein the slow overload detection circuit is configured for generating the slow overload detection signal when current sensed power device current values are greater than previous sensed power device current values.

Example 12. A gate driver system comprises a power device including a resistance and an inductance; a gate driver having a first input for receiving a digital input signal, a second input for receiving a short circuit protection signal, and output for driving the power device; a current reconstruction circuit having a first input for receiving a voltage across the resistance and the inductance, a second input for receiving a current associated with the power device, a third input for receiving the digital input signal, and an output for providing a sensed power device current; and a comparator having a first input coupled to the output of the current reconstruction circuit, a second input coupled to a reference, and an output coupled to the second input of the gate driver.

Example 13. The gate driver system of example 12, wherein the current reconstruction circuit comprises a calibration circuit for determining a resistance value of the resistance and an inductance value of the inductance.

Example 14. The gate driver system of any of the above examples, wherein the power device comprises a four-terminal device comprising a first current terminal, a second current terminal, a Kelvin current terminal, and a control terminal.

Example 15. The gate driver system of any of the above examples, wherein the current reconstruction circuit comprises a slow overload detection circuit.

Example 16. The gate driver system of any of the above examples, wherein the slow overload detection circuit comprises a lookup table for storing sensed power device current values.

Example 17. The gate driver system of any of the above examples, wherein the current reconstruction circuit comprises an integrator circuit.

Example 18. A method of operating a power device comprising measuring a voltage across an inductance associated with the power device; measuring a current associated with the power device; integrating the voltage across the inductance to provide an integrated value; dividing the integrated value by an inductance value of the inductance value to provide a sensed power device current; and turning off the power device if the sensed power device current is greater than a reference current.

Example 19. The method of example 18, further comprising determining the inductance value of the inductance associated with the power device from the measured voltage across the inductance associated with the power device and the measured current associated with the power device.

Example 20. The method of any of the above examples, further comprising measuring a voltage across a resistance in series with the inductance associated with the power device.

Example 21. The method of any of the above examples, further comprising determining a resistance value of the resistance.

Example 22. The method of any of the above examples, wherein measuring the voltage across an inductance associated with the power device comprises measuring at least the voltage at a Kelvin current terminal of the power device.

Example 23. The method of any of the above examples, wherein the reference current comprises a previous sensed power device current.

While an early desaturation detection system, circuit, and method have been described as being implemented with an IGBT power device, it will be apparent to those skilled in the art that any power device or multiple devices can be used including a MOSFET power device, a Silicon Carbide (SiC) power device, a deep trench isolation device or devices, or any other type of integrated circuit power device. The inductance described herein can comprise the existing bondwire inductance of an IGBT power device, and can be measured across existing an existing current terminal such as an emitter terminal, and an existing Kelvin current terminal such as a Kelvin emitter terminal. Various components have been described that can be integrated together on a single integrated circuit, on several different integrated circuits, or implemented as discrete components if desired. While specific values of current, voltage, power, time, and other values have been set forth, these values can and will change for a specific application.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A gate driver system comprising:
    a gate driver having a first input for receiving a digital input signal, a second input for receiving a short circuit protection signal, and an output for driving a power device;
    a current reconstruction circuit having a first input for receiving a voltage across an inductance associated with the power device, a second input for receiving a current associated with the power device, a third input for receiving the digital input signal, and an output for providing a sensed power device current; and
    a comparator having a first input coupled to the output of the current reconstruction circuit, a second input coupled to a reference, and an output coupled to the second input of the gate driver.

2. The gate driver system of claim 1, wherein the current reconstruction circuit comprises a calibration circuit for determining an inductance value associated with the power device.

3. The gate driver system of claim 2, wherein the calibration circuit is also configured for determining a resistance value associated with the power device.

4. The gate driver system of claim 3, wherein the current reconstruction circuit comprises:
    a summing circuit having a first input coupled to the first input of the current reconstruction circuit, a second input, and an output;
    an integrator circuit coupled to the output of the summing circuit;
    a divider circuit having a first input coupled to the output of the integrator circuit, a second input for receiving the inductance value from the calibration circuit, and an output coupled to the output of the current reconstruction circuit; and
    a multiplier circuit having a first input coupled to the output of the current reconstruction circuit, a second input for receiving the resistance value from the calibration circuit, and an output coupled to the second input of the summing circuit.

5. The gate driver system of claim 3, wherein the calibration circuit comprises:
    a summing circuit having a first input for receiving a first voltage from the first input of the current reconstruction circuit, a second input for receiving a second voltage from the first input of the current reconstruction circuit, and an output;
    an integrator circuit having an input coupled to the output of the summing circuit, and an output;
    a first divider circuit having a first input coupled to the output of the integrator circuit, a second input coupled to the second input of the current reconstruction circuit, and an output for providing the inductance value; and
    a second divider circuit having a first input for receiving the second voltage from the first input of the current reconstruction circuit, a second input coupled to the second input of the current reconstruction circuit, and an output for providing the resistance value.

6. The gate driver system of claim 5, wherein the first voltage from the first input of the current reconstruction circuit comprises a voltage corresponding to a positive change in current through the inductance and the resistance.

7. The gate driver system of claim 5, wherein the second voltage from the first input of the current reconstruction circuit comprises a voltage corresponding to a zero change in current through the inductance and the resistance.

8. The gate driver system of claim 1, wherein the current reconstruction circuit further comprises a slow overload detection circuit.

9. The gate driver system of claim 8, wherein the slow overload detection circuit comprises a first input coupled to the output of the current reconstruction circuit, a second input coupled to the third input of the current reconstruction circuit, and an output for providing a slow overload detection signal.

10. The gate driver system of claim 9, wherein the output of the slow overload detection circuit is coupled to the comparator of the current reconstruction circuit.

11. The gate driver system of claim 9, wherein the slow overload detection circuit is configured for generating the slow overload detection signal when current sensed power device current values are greater than previous sensed power device current values.

12. A gate driver system comprising:
    a power device including a resistance and an inductance;

a gate driver having a first input for receiving a digital input signal, a second input for receiving a short circuit protection signal, and an output for driving the power device;

a current reconstruction circuit having a first input for receiving a voltage across the resistance and the inductance, a second input for receiving a current associated with the power device, a third input for receiving the digital input signal, and an output for providing a sensed power device current; and a comparator having a first input coupled to the output of the current reconstruction circuit, a second input coupled to a reference, and an output coupled to the second input of the gate driver.

13. The gate driver system of claim 12, wherein the current reconstruction circuit comprises one or more of a calibration circuit for determining a resistance value of the resistance and an inductance value of the inductance, a slow overload detection circuit and an integrator circuit.

14. The gate driver system of claim 12, wherein the power device comprises a four-terminal device comprising a first current terminal, a second current terminal, a Kelvin current terminal, and a control terminal.

15. The gate driver system of claim 12, wherein the current reconstruction circuit comprises a slow overload detection circuit and wherein the slow overload detection circuit comprises a lookup table for storing sensed power device current values.

16. A method of operating a power device, the method comprising:

measuring a voltage across an inductance associated with the power device;

measuring a current associated with the power device;

integrating the voltage across the inductance to provide an integrated value;

dividing the integrated value by an inductance value of the inductance to provide a sensed power device current; and turning off the power device if the sensed power device current is greater than a reference current.

17. The method of claim 16, further comprising determining the inductance value of the inductance associated with the power device from the measured voltage across the inductance associated with the power device and the measured current associated with the power device.

18. The method of claim 16, further comprising measuring a voltage across a resistance in series with the inductance associated with the power device.

19. The method of claim 18, further comprising determining a resistance value of the resistance.

20. The method of claim 16, wherein measuring the voltage across the inductance associated with the power device comprises measuring at least the voltage at a Kelvin current terminal of the power device.

* * * * *